(12) United States Patent
Motomura

(10) Patent No.: US 7,616,040 B2
(45) Date of Patent: Nov. 10, 2009

(54) FLIP-FLOP AND SEMICONDUCTOR INTEGRATED CIRCUIT

(75) Inventor: Tetsuo Motomura, Kanagawa (JP)

(73) Assignee: Sony Corporation, Tokyo (JP)

( * ) Notice: Subject to any disclaimer, the term of this patent is extended or adjusted under 35 U.S.C. 154(b) by 72 days.

(21) Appl. No.: 11/976,244

(22) Filed: Oct. 23, 2007

(65) Prior Publication Data
US 2008/0258789 A1    Oct. 23, 2008

(30) Foreign Application Priority Data
Dec. 8, 2006    (JP) .............................. P2006-331477

(51) Int. Cl.
*H03K 3/289* (2006.01)
(52) U.S. Cl. .................. 327/202; 327/212; 327/218; 327/219
(58) Field of Classification Search ......... 327/202–203, 327/208, 210–212, 214, 215, 217–219
See application file for complete search history.

(56) References Cited

U.S. PATENT DOCUMENTS 6,614,276 B2 * 9/2003 Robertson et al. ........... 327/211
7,492,202 B2 * 2/2009 Inoue .......................... 327/203
2004/0090256 A1 * 5/2004 Cho ............................ 327/202

FOREIGN PATENT DOCUMENTS

| JP | 05-191219 | 7/1993 |
|----|-----------|--------|
| JP | 08-256044 | 10/1996 |
| JP | 09-284101 | 10/1997 |
| JP | 11-284493 | 10/1999 |
| JP | 2001-257566 | 9/2001 |

* cited by examiner

*Primary Examiner*—Long Nguyen
(74) *Attorney, Agent, or Firm*—Rader, Fishman & Grauer PLLC

(57) ABSTRACT

A flip-flop is disclosed which includes: a clock supply circuit configured to output or fix a clock signal alternating between two predetermined states in accordance with a sleep signal; a first holding circuit configured to fetch or hold an input signal in accordance with a state the clock signal indicates; a second holding circuit configured to fetch or hold a first signal output by the first holding circuit in accordance with a state the clock signal indicates; an input switching circuit configured to supply as the input signal a second signal output by the second holding circuit or to supply an external signal as the input signal in accordance with the hold signal; and a power supply control circuit configured to supply or not to supply power to the first holding circuit and the input switching circuit in accordance with a power supply control signal.

9 Claims, 8 Drawing Sheets

FIG. 5
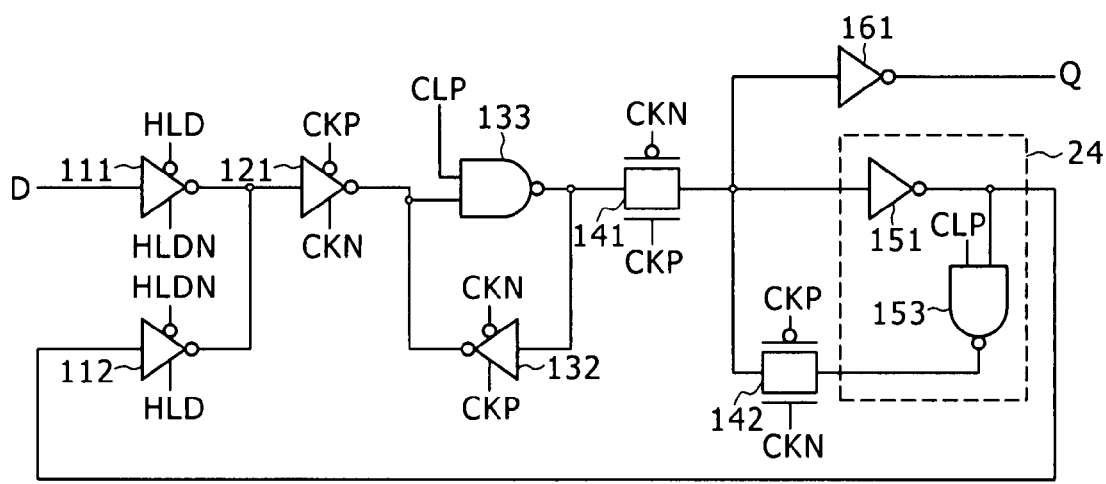
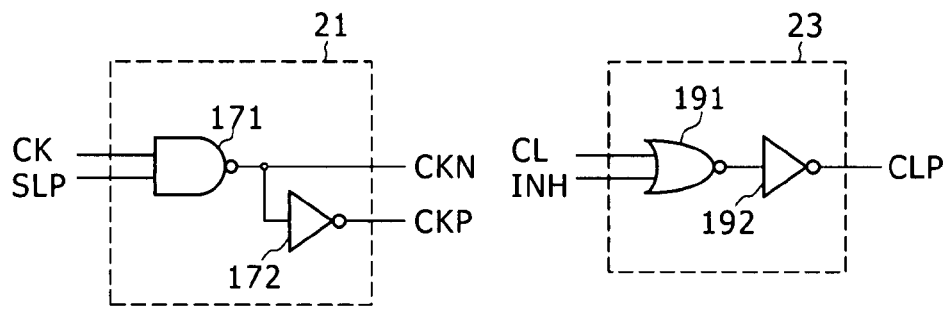
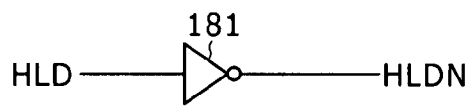

FIG.7
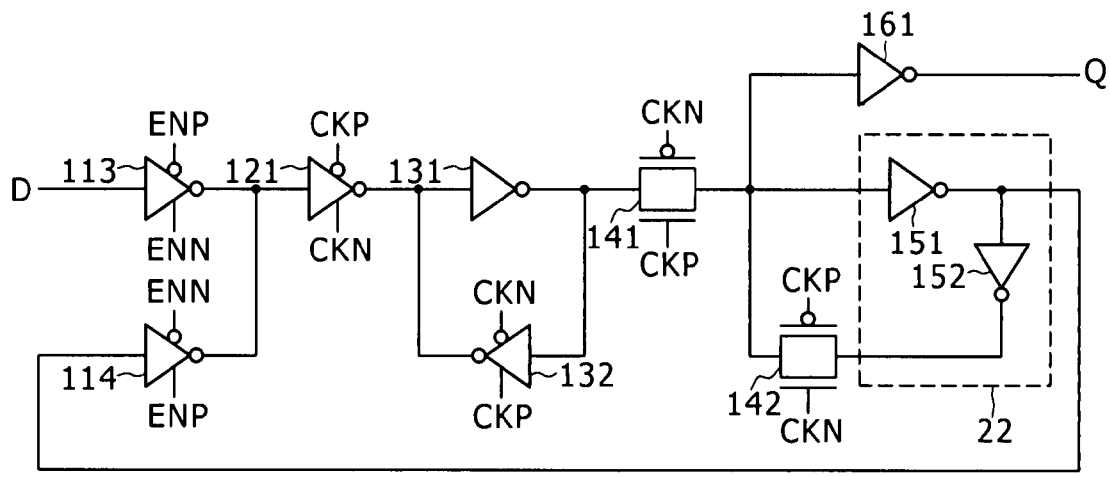
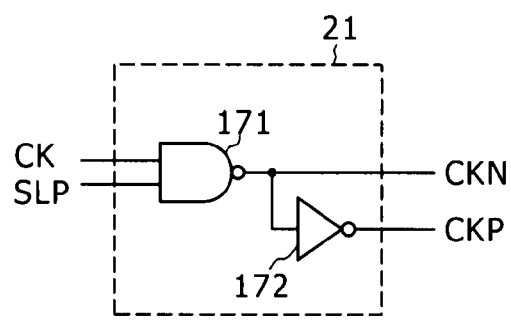
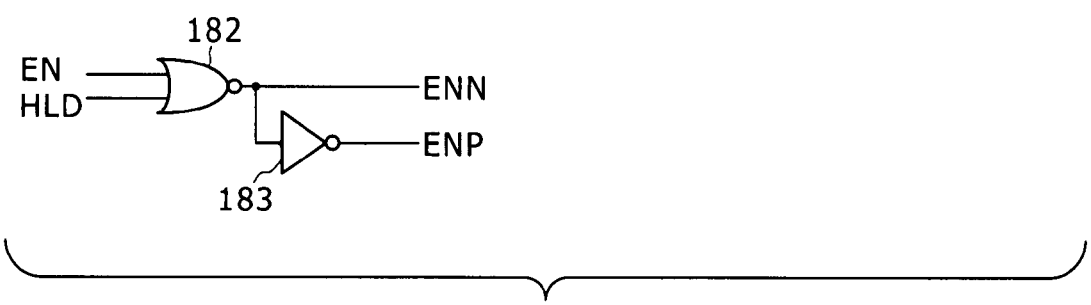

FIG.8
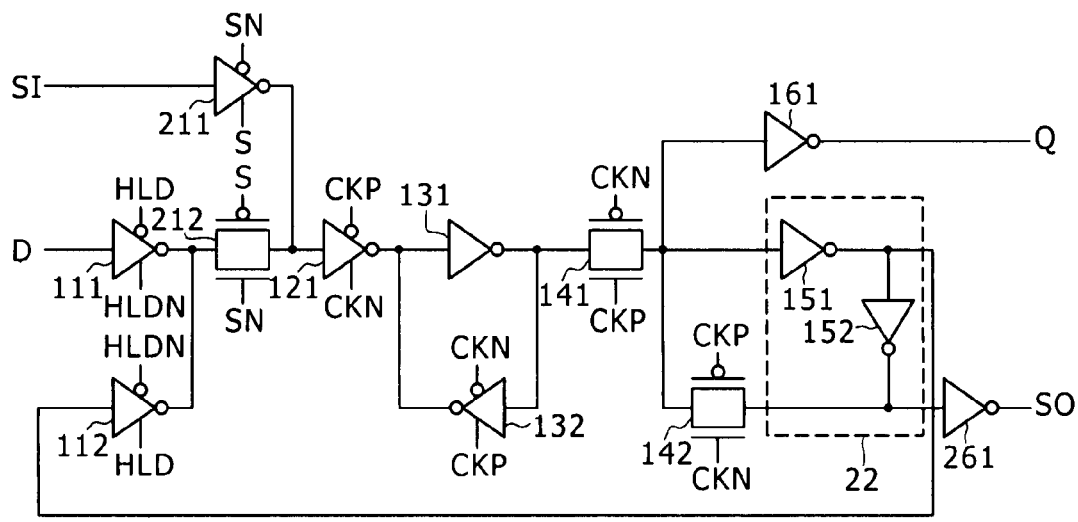
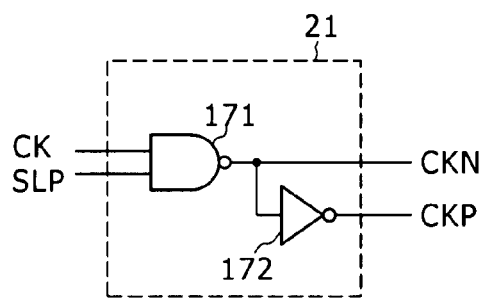
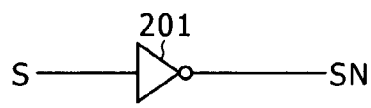
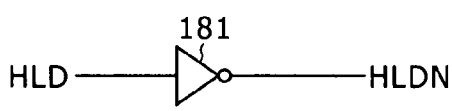

FLIP-FLOP AND SEMICONDUCTOR INTEGRATED CIRCUIT

CROSS REFERENCES TO RELATED APPLICATIONS

The present invention contains subject matter related to Japanese Patent Application JP 2006-331477 filed with the Japan Patent Office on Dec. 8, 2006, the entire contents of which are incorporated herein by reference.

BACKGROUND OF THE INVENTION

1. Field of the Invention

The present invention relates to a semiconductor integrated circuit. More particularly, the invention relates to a semiconductor integrated circuit capable of controlling part of the power being supplied to its flip-flops.

2. Description of the Related Art

MTCMOS (multi-threshold-voltage complementary metal oxide semiconductor) technology has been known as a way to save power in semiconductor integrated circuits. The circuit blocks to which the MTCMOS technology is applied include functional blocks with low thresholds for operating on low voltages and switches for shutting down leak currents in a standby state.

Illustratively, as shown in FIG. 1, a MTCMOS functional block 910 has logic gates 911 and 912 connected to a virtual ground line VSS1 (903). The virtual ground line VSS1 (903) is connected to an actual ground line VSS (901) with a MTCMOS switch 931 connected interposingly therebetween. In a standby mode, a control signal PG is issued to turn off the MTCMOS switch 931 to stop the supply of power, thus inhibiting leak currents.

If the power to all cells is stopped, the data held by flip-flop cells and latch cells will be lost. If these cells are each implemented as a non-MTCMOS functional block 920, then the data held therein is retained but logic gates 921 and 922 in the non-MTCMOS functional block 920 are powered continuously even while the MTCMOS switch 931 is being disconnected. This arrangement thus defeats the power-saving feature originally targeted by the MTCMOS technology.

In an attempt to bypass the difficulty above, MTCMOS flip-flops and MTCMOS latches have been proposed to make up a minimum of non-MTCMOS elements that keep data held intact in each cell. A similar technique involves having master flip-flops constituted by low-threshold transistors and slave flip-flops by high-threshold transistors that remain active in the standby mode, thereby averting the erasure of stored data (e.g., see Japanese Patent Laid-Open No. Hei 11-284493, with reference to FIG. 4).

SUMMARY OF THE INVENTION

However, if part of each flip-flop is made up of MTCMOS elements, it is difficult to regulate the timings between control signals on the one hand and a data input signal and a clock signal on the other hand for the MTCMOS switch. Specifically, where the slave flip-flop is to hold data in the standby mode, the master flip-flop could erroneously fetch the next data input signal when the clock signal is stopped or again activated. The timings need to be controlled adequately to prevent such a flip-flop malfunction. The controls involved thus make it difficult to utilize the MTCMOS technology in designing ASICs (application specific integrated circuits).

The present invention has been made in view of the above circumstances and provides arrangements for making the timing adjustments easier in partially stopping the supply of power to flip-flops.

In carrying out the present invention and according to one embodiment thereof, there is provided a flip-flop including: a clock supply circuit configured to output a clock signal alternating between a first state and a second state when a sleep signal is inactive, and to fix the clock signal in the first state when the sleep signal is active; a first holding circuit configured to fetch an input signal while the clock signal is indicating the first state, and to hold the input signal while the clock signal is indicating the second state; a second holding circuit configured to fetch a first signal output by the first holding circuit while the clock signal is indicating the second state, and to hold the first signal while the clock signal is indicating the first state; an input switching circuit configured to supply as the input signal a second signal output by the second holding circuit when a hold signal is active, and to supply an external signal as the input signal when the hold signal is inactive; and a power supply control circuit configured to supply power to the first holding circuit and the input switching circuit when a power supply control signal is active, and not to supply power to the first holding circuit and the input switching circuit when the power supply control signal is inactive. The flip-flop according to this embodiment of the present invention allows the second holding circuit to hold the signal while the first holding circuit and the input switching circuit are not being powered, and to feed the signal back to the first holding circuit when the hold signal is active. With this embodiment, the power supply control circuit may be practiced preferably in the form of a MTCMOS switch.

Preferably, the flip-flop of the embodiment above may further include a clearing circuit configured to clear the signal held by the second holding circuit when a clear signal is active, or a preset circuit configured to preset the signal held by the second holding circuit when a preset signal is active. This preferred variation of the present invention allows the signal held by the second holding circuit to be set in the desired state. In another preferred structure of the invention, the clearing circuit may not clear the signal held by the second holding circuit or the preset circuit may not preset the signal held by the second holding circuit when an inhibit signal is active, regardless of what state the clear signal is or the preset signal is in.

According to another embodiment of the present invention, there is provided a flip-flop including: a clock supply circuit configured to output a clock signal alternating between a first state and a second state when a sleep signal is inactive, and to fix the clock signal in the first state when the sleep signal is active; a first holding circuit configured to fetch an input signal while the clock signal is indicating the first state, and to hold the input signal while the clock signal is indicating the second state; a second holding circuit configured to fetch a first signal output by the first holding circuit while the clock signal is indicating the second state, and to hold the first signal while the clock signal is indicating the first state; an input switching circuit configured to supply as the input signal a second signal output by the second holding circuit either when a hold signal is active or when an enable signal is inactive, and to supply an external signal as the input signal both when the hold signal is inactive and when the enable signal is active; and a power supply control circuit configured to supply power to the first holding circuit and the input switching circuit when a power supply control signal is active, and not to supply power to the first holding circuit and the input switching circuit when the power supply control signal is inactive. The flip-flop according to this embodiment of the present invention allows the second holding circuit to hold the signal while the first holding circuit and the input switching circuit are not being powered, and to feed the signal back to the first holding circuit when the hold signal is active or the enable signal is inactive.

According to a further embodiment of the present invention, there is provided a flip-flop including: a clock supply circuit configured to output a clock signal alternating between a first state and a second state when a sleep signal is inactive, and to fix the clock signal in the first state when the sleep signal is active; a first holding circuit configured to fetch an input signal while the clock signal is indicating the first state, and to hold the input signal while the clock signal is indicating the second state; a second holding circuit configured to fetch a first signal output by the first holding circuit while the clock signal is indicating the second state, and to hold the first signal while the clock signal is indicating the first state; an input switching circuit configured to supply a scan-in signal as the input signal when a scan mode signal indicates that a scan mode is in effect, to supply as the input signal a second signal output by the second holding circuit both when the scan mode signal indicates that scan mode is not in effect and when a hold signal is active, and to supply an external signal as the input signal when the hold signal is inactive; and a power supply control circuit configured to supply power to the first holding circuit and the input switching circuit when a power supply control signal is active, and not to supply power to the first holding circuit and the input switching circuit when the power supply control signal is inactive. A scan path is thus formed in the flip-flop according to the above embodiment, wherein the second holding circuit is allowed to hold the signal while the first holding circuit and input switching circuit are not being powered and to feed the signal back to the first holding circuit in a suitably timed manner.

According to an even further embodiment of the present invention, there is provided a semiconductor integrated circuit including: a clock supply circuit configured to output a clock signal alternating between a first state and a second state when a sleep signal is inactive, and to fix the clock signal in the first state when the sleep signal is active; a first holding circuit configured to fetch an input signal while the clock signal is indicating the first state, and to hold the input signal while the clock signal is indicating the second state; a second holding circuit configured to fetch a first signal output by the first holding circuit while the clock signal is indicating the second state, and to hold the first signal while the clock signal is indicating the first state; an input switching circuit configured to supply as the input signal a second signal output by the second holding circuit when a hold signal is active, and to supply an external signal as the input signal when the hold signal is inactive; a power supply control circuit configured to supply power to the first holding circuit and the input switching circuit when a power supply control signal is active, and not to supply power to the first holding circuit and the input switching circuit when the power supply control signal is inactive; and a flip-flop control circuit configured to set the power supply control signal not to be active only when at least the sleep signal is active, and to set the power supply control signal to be active only when at least the hold signal is active. The semiconductor integrated circuit according to the embodiment above of the present invention allows the second holding circuit to hold the signal while the first holding circuit and the input switching circuit are not being powered and to feed the signal back to the first holding circuit when the hold signal is active.

The present invention, when embodied illustratively as outlined above makes it appreciably easier to adjust the timings for stopping in part the supply of power to flip-flops.

BRIEF DESCRIPTION OF THE DRAWINGS

Further advantages of the present invention will become apparent upon a reading of the following description and appended drawings in which:

FIG. 5 is a schematic circuit diagram showing one variation of the flip-flop according to an embodiment of the present invention;

FIG. 7 is a schematic circuit diagram showing a further variation of the flip-flop according to an embodiment of the present invention; and FIG. 8 is a schematic circuit diagram showing an even further variation of the flip-flop according to an embodiment of the present invention.

DETAILED DESCRIPTION OF THE PREFERRED EMBODIMENTS

Preferred embodiments of the present invention will now be described in detail with reference to the accompanying drawings.

Figure 1:
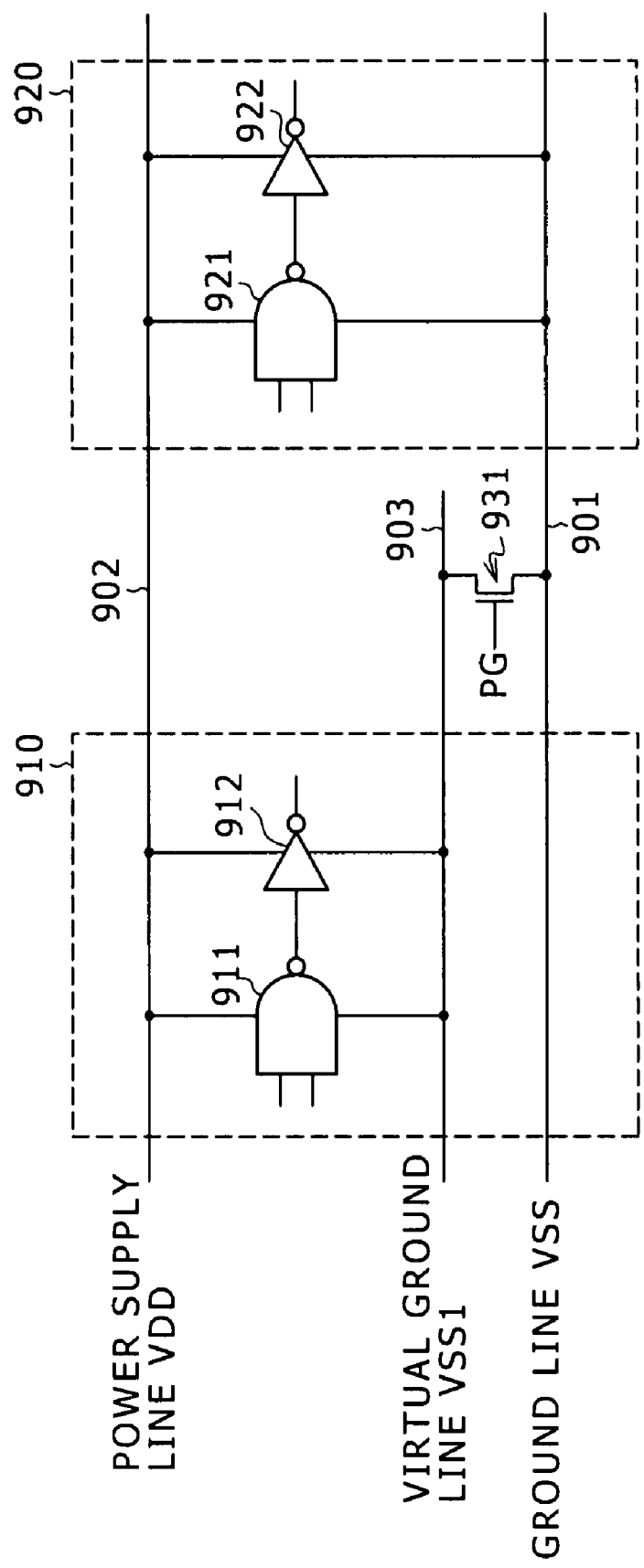
FIG. 1 is a schematic circuit diagram illustrating a basic circuit structure of a MTCMOS.

FIG. 1 is a schematic circuit diagram illustrating a basic circuit structure of a MTCMOS. In the MTCMOS, a functional block 910 has logic gates 911 and 912 connected to a virtual ground line VSS1 (903). A MTCMOS switch 931 is connected interposingly between the virtual ground line VSS1 (903) and an actual ground line VSS (901). In the standby mode, the MTCMOS switch 931 is disconnected by a control signal PG, cutting off the supply of power to the MTCMOS and preventing leak currents flowing from a power supply line VDD (902) to the ground line VSS (901). Since the power supply line VDD (902) is connected to a PMOS substrate and the ground line VSS (901) to a NMOS substrate, the substrate current will not be interrupted even after the MTCMOS switch 931 is disconnected.

In a non-MTCMOS functional block 920, logic gates 921 and 922 are connected to the power supply line VDD (902) and the ground line VSS (901). Thus, the supply of power is not cut off after the MTCMOS switch 931 is disconnected.

The present invention presupposes circuit blocks which each have the MTCMOS functional block 910 coexisting with the non-MTCMOS functional block 920.

Figure 2:
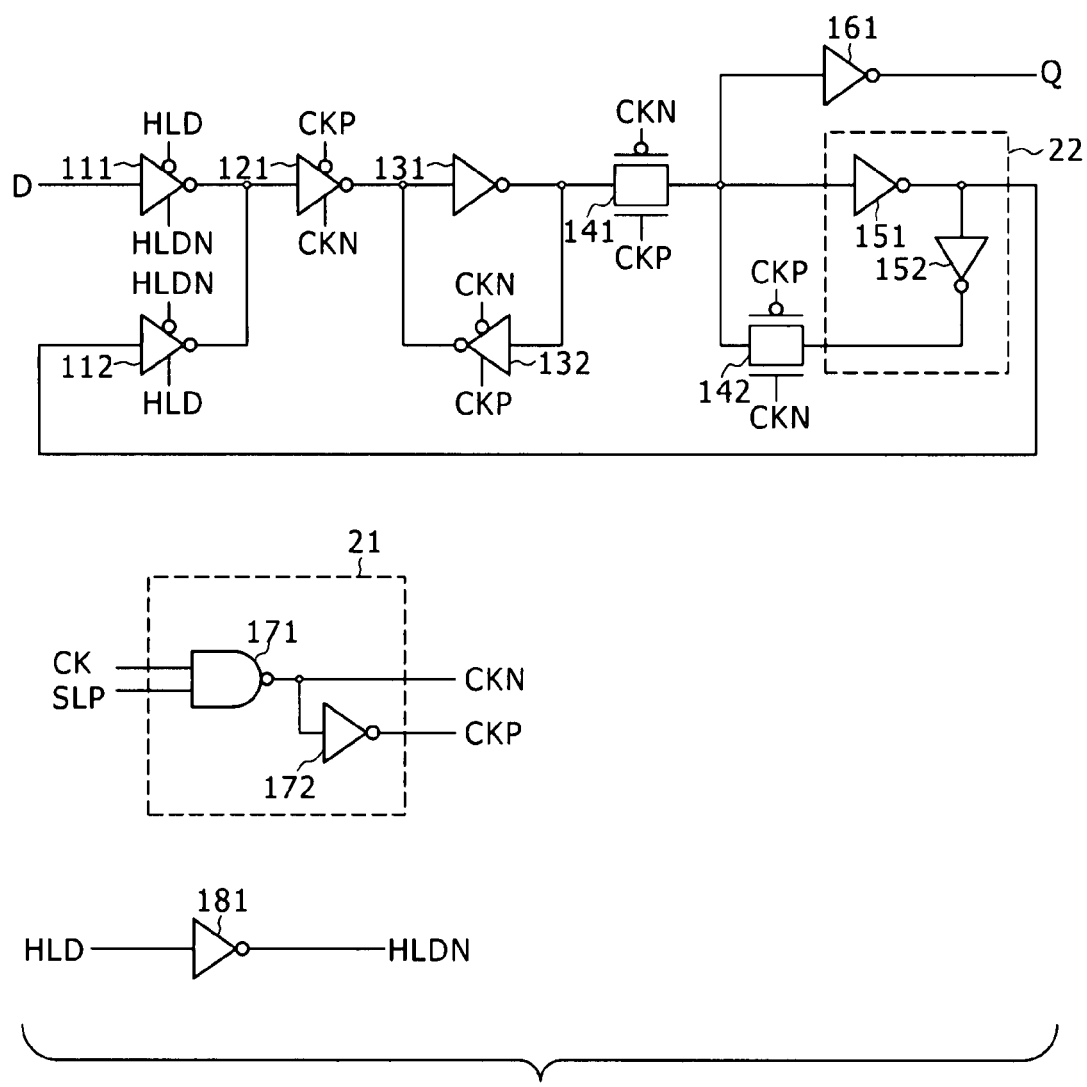
FIG. 2 is a schematic circuit diagram showing a typical structure of a flip-flop according to an embodiment of the present invention.

FIG. 2 is a schematic circuit diagram showing a typical structure of a flip-flop embodying the present invention. The flip-flop includes clocked inverters 111, 112, 121 and 132, inverters 131, 151, 152, 161, 172 and 181, transmission gates 141 and 142, and a NAND gate 171. In this flip-flop, except for a non-MTCMOS functional block 21 constituted by the NAND gate 171 and the inverter 172 and for a non-MTCMOS functional block 22 made up of the inverters 151 and 152, the supply of power to the gates are stopped when the MTCMOS switch 931 is disconnected. By contrast, the gates belonging to the non-MTCMOS functional blocks 21 and 22 are kept powered even after the MTCMOS switch 931 is disconnected.

The flip-flop receives a data input signal D, a clock signal CK, a hold signal HLD, and a sleep signal SLP. The data input signal D is issued to input the data to be held by the flip-flop. The clock signal CK is used to provide the reference for synchronizing the flip-flop.

The hold signal HLD is a control signal that causes the flip-flop to hold data while interrupting the input from the outside. The sleep signal SLP is a control signal that renders the flip-flop inactive by cutting off the supply of the clock signal CK.

The MTCMOS switch 931 (FIG. 1) is supplied with a MTCMOS control signal PG that turns on or off the supply of power to the MTCMOS functional blocks.

The clock signal CK and the sleep signal SLP are input to the NAND gate 171. The NAND gate 171 is a circuit that generates a NAND between the clock signal CK and the sleep signal SLP. That is, the NAND gate 171 outputs an inverted signal of the clock signal CK unless and until the sleep signal SLP goes active. Being a negative logic signal, the sleep signal SLP remains High when not going active and is driven Low when going active. It follows that an inverted clock signal CKN output by the NAND gate 171 is the inverted signal of the clock signal CK when the sleep signal SLP is inactive, and that the NAND gate 171 has its output driven High while interrupting the clock signal CK when the sleep signal SLP goes active.

The output of the NAND gate 171 is connected to the inverter 172 whose output is a non-inverted clock signal CKP. The non-inverted clock signal CKP is furnished as the clock signal CK when the sleep signal SLP is inactive and becomes a Low output when the sleep signal SLP goes active.

The hold signal HLD is input to the inverter 181. The inverter 181 inverts the hold signal HLD so as to output an inverted hold signal HLDN.

The clocked inverters 111 and 112 constitute a circuit that controls the input to the flip-flop. That is, when the hold signal HLD is inactive, the clocked inverter 111 inputs an inverted signal of the data input signal D to the flip-flop. When the hold signal HLD goes active, the clocked inverter 112 inputs an inverted signal of the output from the inverter 151 to the flip-flop through a feedback loop. Because the clocked inverters 111 and 112 receive control signals with their phases opposite to each other, each of the inverters can input a mutually exclusive signal.

The inverter 131 and the clocked inverter 132 are storage elements constituting a master flip-flop. When the non-inverted clock signal CKP is driven Low, the master flip-flop receives the input signal from the clocked inverter 111 or 112 at a leading edge of the clock signal. The master flip-flop holds the received signal while the non-inverted clock signal CKP remains High.

The input of the inverter 131 is connected to the outputs of the clocked inverters 121 and 132. While the non-inverted clock signal CKP is being Low, the clocked inverter 121 supplies the input of the inverter 131 with an inverted signal of the signal coming from the clocked inverter 111 or 112; while the non-inverted clock signal CKP is being High, the clocked inverter 132 supplies the input of the inverter 131 with an inverted signal of the output signal from the inverter 131. Because the clocked inverters 121 and 132 receive control signals with their phases opposite to each other, each of the inverters can supply a mutually exclusive signal.

The inverters 151 and 152 are storage elements that constitute a slave flip-flop. When the non-inverted clock signal CKP is driven High, the slave flip-flop receives the signal from the master flip-flop at a trailing edge of the clock signal. The slave flip-flop holds the received signal while the non-inverted clock signal CKP remains Low. The inverters 151 and 152 are kept powered after the MTCMOS switch 931 is disconnected, so that the data is held intact. This makes it possible for the slave flip-flop to supply the master flip-flop with the data being kept after a reset through the use of a feedback loop.

The input of the inverter 151 is connected to the outputs of the transmission gates 141 and 142. While the non-inverted clock signal CKP is being High, the transmission gate 141 supplies the input of the inverter 151 with the signal coming from the master flip-flop; while the non-inverted clock signal CKP is being Low, the transmission gate 142 supplies the input of the inverter 151 with the output signal from the inverter 152. Because the transmission gates 141 and 142 receive control signals with their phases opposite to each other, each of the gates can supply a mutually exclusive signal.

The input of the inverter 151 is connected to the input of the inverter 161. The output of the inverter 161 provides an output Q of the flip-flop.

Figure 3:
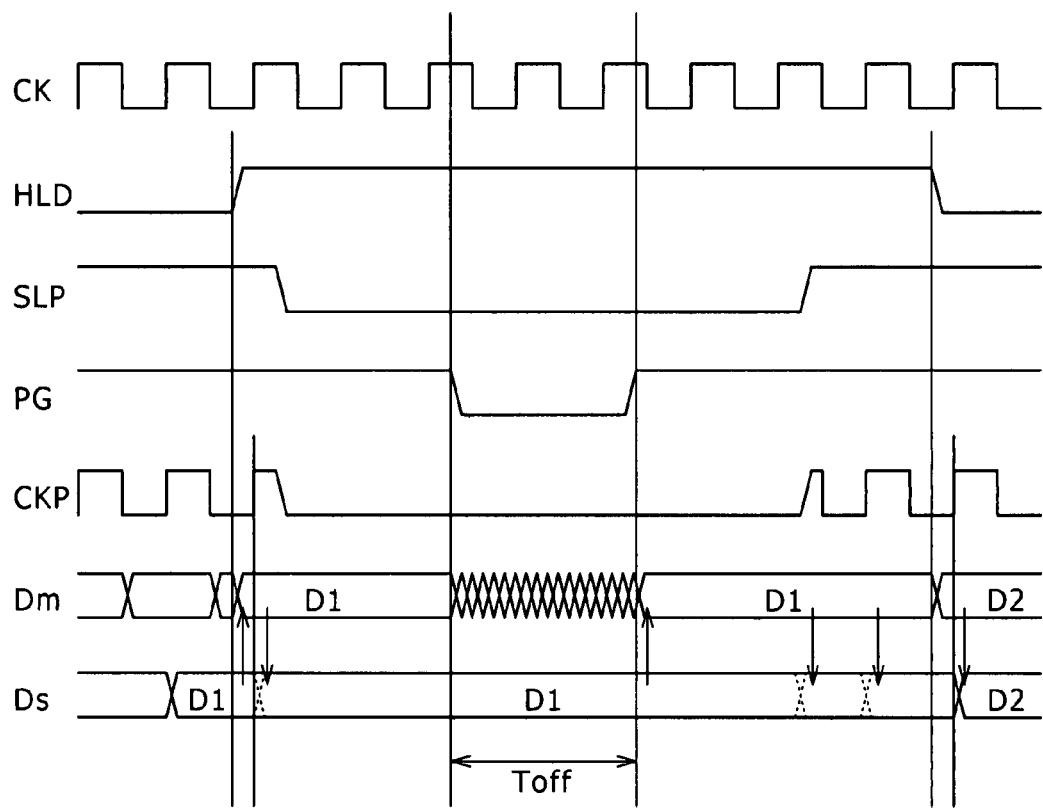
FIG. 3 is a timing chart showing typical operation timings of the flip-flop according to an embodiment of the present invention.

FIG. 3 is a timing chart showing typical operation timings of the flip-flop embodying the present invention.

The clock signal CK provides the reference for synchronizing the flip-flop and alternates between Low and High.

The hold signal HLD is a control signal that interrupts the input from the outside. When the hold signal HLD is inactive (Low), the data input signal D is input to the master flip-flop; when the hold signal HLD goes active (High), an output signal Ds of the slave flip-flop is input to the master flip-flop.

In the diagram of FIG. 3, when the hold signal HLD goes active (High), the non-inverted clock signal CKP is Low so that the master flip-flop receives the output signal Ds (D1) of the slave flip-flop; an output signal Dm of the master flip-flop also turns out to be D1 (see an upward-pointing arrow). It should be noted that with the hold signal going active (High), the output of the master flip-flop is input to the slave-flip-flop as long as the non-inverted clock signal CKP remains High (see a downward-pointing arrow).

The sleep signal SLP is a control signal that interrupts the supply of the clock signal CK. When the sleep signal SLP is inactive (High), the clock signal CK is supplied as the non-inverted clock signal CKP. When the sleep signal SLP goes active (Low), the clock signal CK is interrupted and the non-inverted clock signal CKP is driven Low. This stops the operation of the flip-flop and inhibits the output of the master flip-flop from getting input to the slave flip-flop.

The MTCMOS control signal PG is a control signal that turns on or off the connection of the MTCMOS switch 931 (FIG. 1). When the MTCMOS control signal PG goes active (High), the MTCMOS switch 931 is connected, supplying power to the gates in the MTCMOS functional block 910; when the MTCMOS control signal PG is inactive (Low), the MTCMOS switch 931 is disconnected to stop power being supplied to the gates in the MTCMOS functional block 910.

Referring to the diagram of FIG. 3, the master flip-flop is not powered during a period Toff in which the MTCMOS control signal PG is inactive (Low). In this case, the output of the master flip-flop is unpredictable. The slave flip-flop continues to retain its data during the period Toff.

When the MTCMOS control signal PG again goes active (High), the data held by the slave flip-flop is fed to the master flip-flop to prepare for the flip-flop to operate again. When the sleep signal SLP goes inactive (High), the flip-flop resumes its operation in synchronism with the clock signal. When the hold signal HLD goes inactive (Low), the next input signal is supplied to the master flip-flop.

As described, the flip-flop is allowed to effect a normal transition to standby mode when the hold signal HLD is first driven active (High) and followed by the sleep signal SLP also driven active (Low), before the MTCMOS switch 931 is disconnected. To effect the normal transition of the flip-flop from standby mode to operation mode involves first connecting the MTCMOS switch 931 and then driving the sleep signal SLP inactive (High), followed by the hold signal HLD also being driven inactive (Low).

That is, the timings are ensured by a nesting arrangement in which the MTCMOS control signal PG is driven inactive (Low) only when at least the sleep signal SLP goes active (Low) and in which the sleep signal SLP is driven active (Low) only when at least the hold signal HLD goes active (High). This makes it significantly easier to adjust the timings involved in partially stopping the supply of power to the flip-flop.

In a traditional setup having no feedback loop ranging from the slave flip-flop to the master flip-flop, as with the embodiment of this invention, it is not easy to adjust the timings for transition to standby mode solely by the method of interrupting the clock signal using the sleep signal SLP. For example, if the sleep signal SLP is driven active (Low) from inactive (High) while the clock signal CK remains High, then the non-inverted clock signal CKP is driven Low, causing the next data input signal to be received erroneously. This problem is bypassed by the embodiment of the invention making the state of the master flip-flop the same as that of the slave flip-flop by having the hold signal HLD driven active (High).

The same applies to the timings for transition from standby mode to operation mode. In a traditional setup, for example, if the sleep signal SLP is driven inactive (High) from active (Low) while the clock signal CK remains High, then the non-inverted clock signal CKP is driven High from Low, causing the next data input signal to be received erroneously. This problem is bypassed by the embodiment of the invention holding the data during the cycle where the hold signal HLD goes inactive (Low), i.e., until the next leading edge of the clock signal CK is reached.

Figure 4:
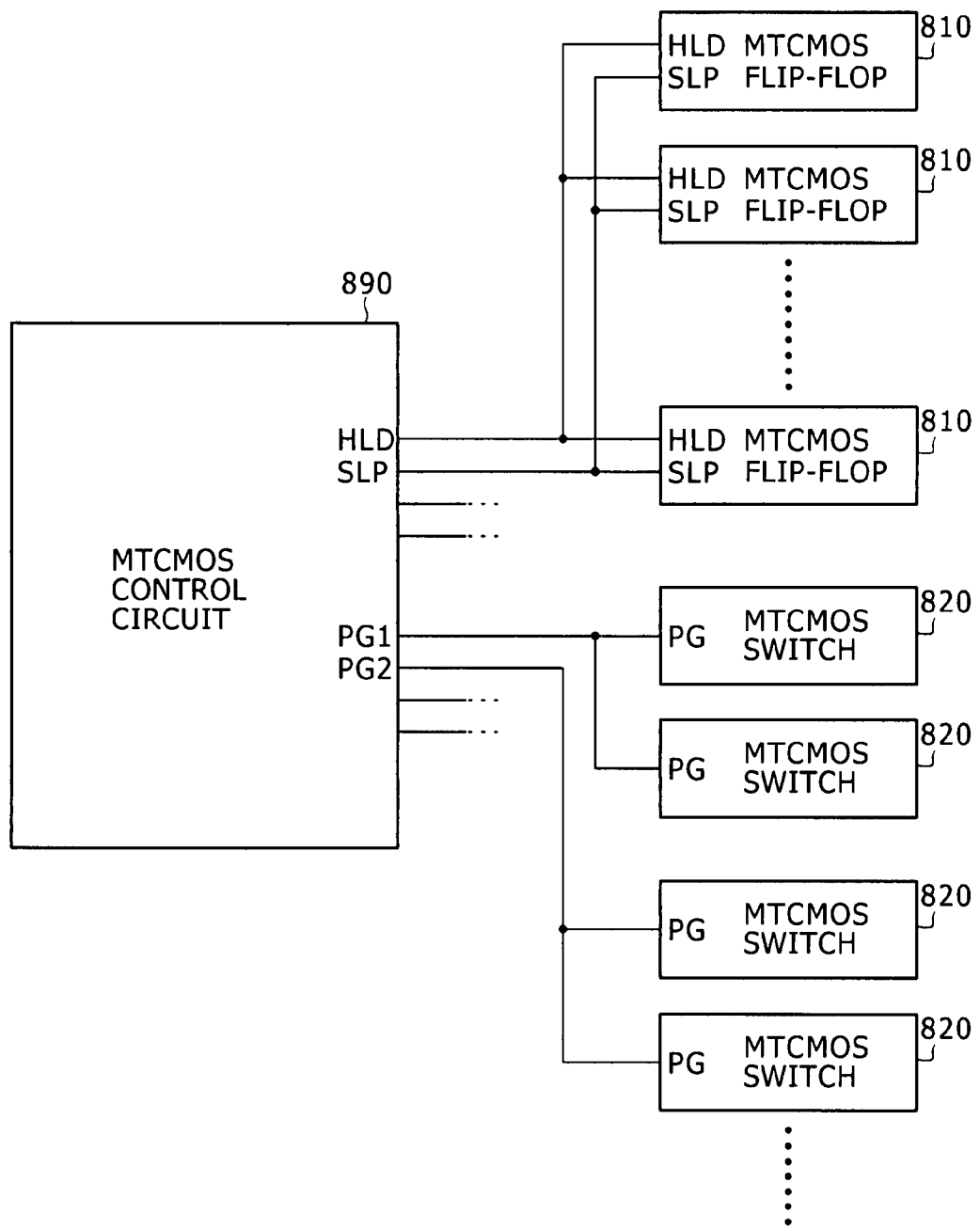
FIG. 4 is a schematic view showing how control signals are typically distributed between flip-flops according to an embodiment of the present invention.

FIG. 4 is a schematic view showing how control signals are typically distributed between flip-flops according to an embodiment of the present invention. The semiconductor integrated circuit of FIG. 4 includes MTCMOS flip-flops 810, MTCMOS switches 820, and a MTCMOS control circuit 890.

The MTCMOS flip-flop 810 corresponds to the flip-flop discussed above in reference to FIG. 2 and includes a MTCMOS functional block and a non-MTCMOS functional block. The MTCMOS switch 820 corresponds to the MTCMOS switch 931 explained above in reference to FIG. 1.

The MTCMOS control circuit 890 is a circuit that supplies control signals to the MTCMOS flip-flops 810 and MTCMOS switches 820. In this example, the MTCMOS control circuit 890 supplies the hold signal HLD and the sleep signal SLP to the MTCMOS flip-flops 810 and the MTCMOS control signal PG to the MTCMOS switches 820.

The MTCMOS control circuit 890 thus manages the control signals in a unified manner. Alternatively, the same type of control signal may be divided and controlled independently. Illustratively, as shown in FIG. 4, the MTCMOS control signal PG may be divided into signals PG1 and PG2 each subject to independent control.

FIG. 5 is a schematic circuit diagram showing a first variation of the flip-flop embodying the invention. The first variation is an embodiment having the function of clearing the data held by the slave flip-flop.

In the setup of FIG. 5, compared with the example of FIG. 2, a clear signal CL and an inhibit signal INH are input as newly added control signals. The clear signal CL is a control signal that inputs the instruction to drive Low the data being held by the slave flip-flop, thus forcibly clearing the data. The inhibit signal INH is a control signal that inhibits the instruction given by the clear signal CL. Illustratively, where the values of all flip-flops are to be reset by connecting the MTCMOS switches 931 that were disconnected, the inhibit signal INH may be issued to keep the data held intact by the MTCMOS's. The clear signal CL is a negative logic signal, and the inhibit signal INH is a positive logic signal.

The clear signal CL and the inhibit signal INH are input to a NOR gate 191. The NOR gate 191 is a circuit that outputs the negative OR between the clear signal CL and the inhibit signal INH. The output of the NOR gate 191 is input to an inverter 192. The inverter 192 outputs a non-inverted clear signal CLP. That is, when the inhibit signal INH remains inactive (Low), the non-inverted clear signal CLP is output as the clear signal CL. When the inhibit signal INH goes active (High), the non-inverted clear signal CLP is fixed to the inactive state (held High). Because the NOR gate 191 and the inverter 192 belong to a non-MTCMOS functional block 23, the supply of power is continued even after the MTCMOS switch 931 is disconnected.

In the first variation of the embodiment, an inverter 151 and a NAND gate 153 constitute a slave flip-flop. Whereas the inverter 151 corresponds to its counterpart in the example of FIG. 2, the inverter 151 is connected not with the inverter 152 but with the NAND gate 153. One input of the NAND gate 153 receives the non-inverted clear signal CLP output by the inverter 192. That is, when the clear signal CL goes active (Low) with the inhibit signal INH brought inactive (Low), the slave flip-flop is cleared and driven Low. When the inhibit signal INH goes active (High), the non-inverted clear signal CLP is fixed to the inactive state (held High). It follows that the slave flip-flop is not cleared even when the clear signal CL is driven active (Low). Because the inverter 151 and the NAND gate 153 belong to a non-MTCMOS functional block 24, the supply of power is continued even after the MTCMOS switch 931 is disconnected.

In the first variation of the embodiment, a NAND gate 133 and a clocked inverter 132 constitute a master flip-flop. Whereas the clocked inverter 132 corresponds to its counterpart in the example of FIG. 2, the inverter 132 is connected not with the inverter 131 but with the NAND gate 133. One input of the NAND gate 133 receives the non-inverted clear signal CLP output by the inverter 192. The NAND gate 133 supplies the NAND calculated between the output signal of the clocked inverter 121 and the non-inverted clear signal CLP to the input of the clocked inverter 132. That is, when the clear signal CL goes active (Low) with the inhibit signal INH brought inactive (Low), the master flip-flop is cleared and driven Low. When the inhibit signal INH goes active (High), the non-inverted clear signal CLP is fixed to the inactive state (held High). For this reason, the master flip-flop is not cleared even when the clear signal CL is brought active (Low).

The gates in FIG. 5, other than those discussed above, are the same as those in the example of FIG. 2. It follows that the NAND gate 171 and the inverter 172 belonging to the non- MTCMOS functional block 21 are kept powered even after the MTCMOS switch 931 is disconnected.

Figure 6:
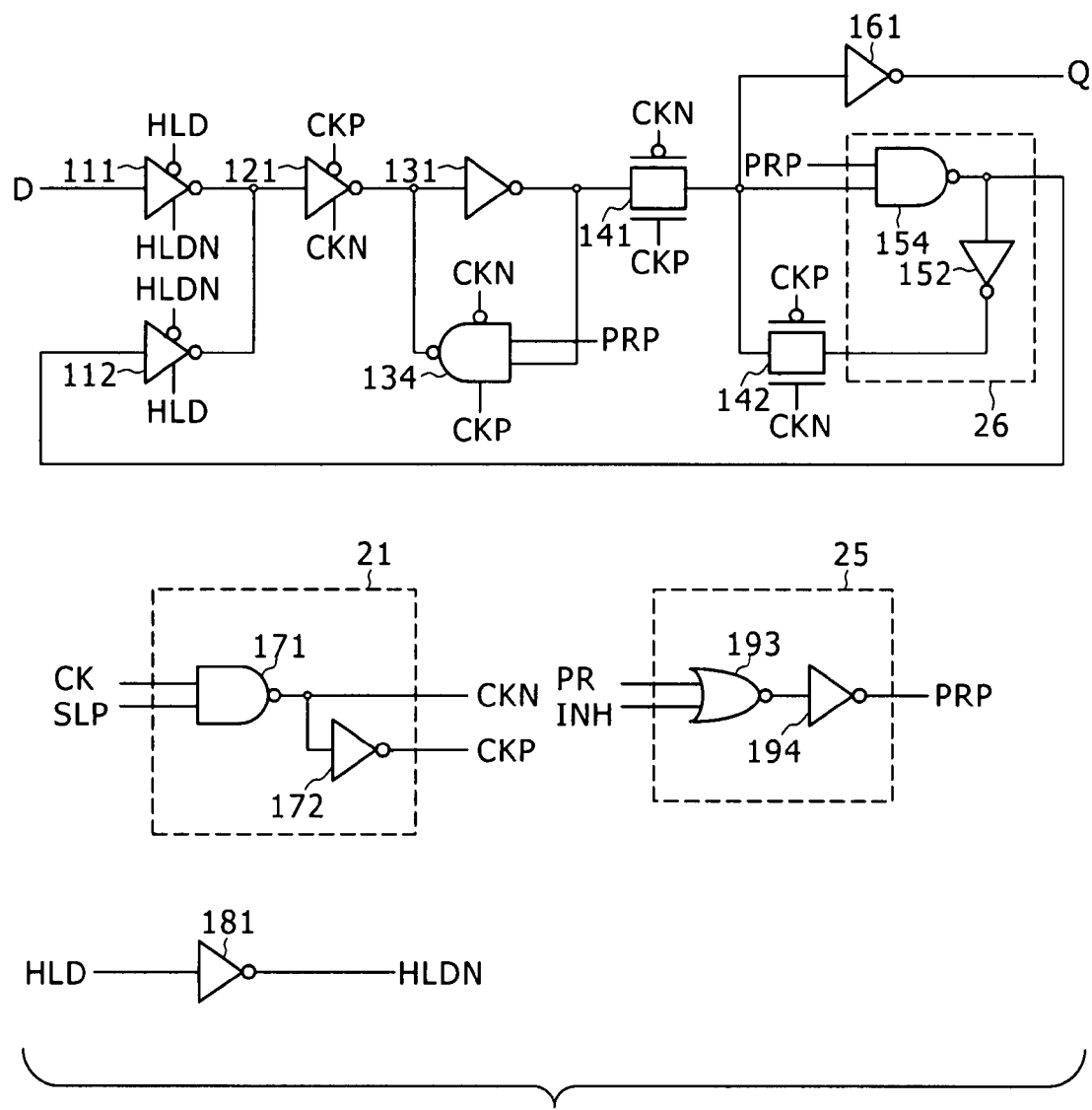
FIG. 6 is a schematic circuit diagram showing another variation of the flip-flop according to an embodiment of the present invention.

FIG. 6 is a schematic circuit diagram showing a second variation of the flip-flop embodying the invention. The second variation is an embodiment having the function of presetting the data to be held by the slave flip-flop.

In the setup of FIG. 6, compared with the example of FIG. 2, a preset signal PR and an inhibit signal INH are input as newly added control signals. The preset signal PR is a control signal that inputs the instruction to drive High the data being held by the slave flip-flop, thus forcibly presetting the data. The inhibit signal INH is a control signal that inhibits the instruction given by the preset signal PR. The preset signal PR is a negative logic signal, and the inhibit signal INH is a positive logic signal.

The preset signal PR and the inhibit signal INH are input to a NOR gate 193. The NOR gate 193 outputs the NOR calculated between the preset signal PR and the inhibit signal INH. The output of the NOR gate 193 is input to an inverter 194. The output of the inverter 194 is a non-inverted preset signal PRP. That is, when the inhibit signal INH remains inactive (Low), the non-inverted preset signal PRP is output as the preset signal PR. When the inhibit signal INH goes active (High), the non-inverted preset signal PRP is fixed to the inactive state (held High). Because the NOR gate 193 and the inverter 194 belong to a non-MTCMOS functional block 25, the supply of power is continued even after the MTCMOS switch 931 is disconnected.

In the second variation of the embodiment, a NAND gate 154 and an inverter 152 constitute a slave flip-flop. Whereas the inverter 152 corresponds to its counterpart in the example of FIG. 2, the inverter 152 is connected not with the inverter 151 but with the NAND gate 154. One input of the NAND gate 154 receives the non-inverted preset signal PRP output by the inverter 194. That is, when the preset signal PR goes active (Low) with the inhibit signal INH brought inactive (Low), the slave flip-flop is preset and held High. When the inhibit signal INH goes active (High), the non-inverted preset signal PRP is fixed to the inactive state (held High). It follows that the slave flip-flop is not preset even when the preset signal PR is driven active (Low). Because the NAND gate 154 and inverter 152 belong to a non-MTCMOS functional block 26, the supply of power is continued even after the MTCMOS switch 931 is disconnected.

In the second variation of the embodiment, an inverter 131 and a clocked NAND gate 134 constitute a master flip-flop. Whereas the inverter 131 corresponds to its counterpart in the example of FIG. 2, the inverter 131 is connected not with the clocked inverter 132 but with the clocked NAND gate 134. One input of the clocked NAND gate 134 receives the non-inverted preset signal PRP output by the inverter 194. The clocked NAND gate 134 supplies the NAND calculated between the output signal of the inverter 131 and the non-inverted preset signal PRP to the input of the inverter 131 only when the non-inverted clock signal CKP goes High. That is, when the preset signal PR goes active (Low) with the inhibit signal INH brought inactive (Low), the master flip-flop is preset and held High. When the inhibit signal INH goes active (High), the non-inverted preset signal PRP is fixed to the inactive state (held High). For this reason, the master flip-flop is not preset even when the preset signal PR is brought active (Low).

The gates in FIG. 6, other than those discussed above, are the same as those in the example of FIG. 2. It follows that the NAND gate 171 and the inverter 172 belonging to the non-MTCMOS functional block 21 are kept powered even after the MTCMOS switch 931 is disconnected.

FIG. 7 is a schematic circuit diagram showing a third variation of the flip-flop embodying the invention. The third variation is an embodiment having the function of controlling whether or not to enable the operation of the slave flip-flop.

In the setup of FIG. 7, compared with the example of FIG. 2, an enable signal EN is input as a newly added control signal. The enable signal EN is a control signal that inputs the instruction whether or not to enable the operation of the slave flip-flop. The enable signal EN is a negative logic signal.

The enable signal EN, along with the hold signal HLD, are input to a NOR gate 182. The NOR gate 182 is a circuit that outputs the NOR calculated between the enable signal EN and the hold signal HLD. The output of the NOR gate 182 is an inverted enable signal ENN that is input to an inverter 183. The output of the inverter 183 is a non-inverted enable signal ENP. That is, when the enable signal EN goes active (Low) with the hold signal HLD brought inactive (Low), the non-inverted enable signal ENP goes active (Low). When the hold signal HLD goes active (High) or when the enable signal EN is inactive (High), the non-inverted enable signal ENP is driven inactive (High). The reverse applies to the inverted enable signal ENN.

The non-inverted enable signal ENP and the inverted enable signal ENN are input to clocked inverters 113 and 114. The clocked inverters 113 and 114 replace the clocked inverters 111 and 112 and control the input to the flip-flop. That is, when the non-inverted enable signal ENP remains inactive, the clocked inverter 113 inputs the inverted signal of the data input signal D to the flip-flop. When the non-inverted enable signal ENP goes active, the clocked inverter 114 inputs the inverted signal of the output of the inverter 151 to the flip-flop through a feedback loop. Because the clocked inverters 113 and 114 receive control signals with their phases opposite to each other, each of the inverters can input a mutually exclusive signal.

The gates in FIG. 7, other than those discussed above, are the same as those in the example of FIG. 2. It follows that the gates belonging to the non-MTCMOS functional blocks 21 and 22 are kept powered even after the MTCMOS switch 931 is disconnected.

FIG. 8 is a schematic circuit diagram showing a fourth variation of the flip-flop embodying the invention. The fourth variation is an embodiment having its slave flip-flop furnished with a scan path.

In the setup of FIG. 8, compared with the example of FIG. 2, a scan mode signal S is input as a newly added control signal. Also provided anew are a scan-in signal SI and a scan-out signal SO for scan path purposes. The scan path is a path through which to set data to a semiconductor integrated circuit for testing and to retrieve data from the semiconductor integrated circuit that have been tested. The scan mode signal S is a control signal that inputs the instruction whether or not to establish a scan path enable mode. The scan mode signal S is a positive logic signal.

The scan mode signal S is input to an inverter 201. In turn, the inverter 201 inverts the scan mode signal S so as to output an inverted scan mode signal SN.

In the fourth variation of the embodiment, a clocked inverter 211 and a transmission gate 212 are parallelly inserted upstream of the master flip-flop, i.e., on the input side of the clocked inverter 121. In this case, when the scan mode signal S goes active (High), the clocked inverter 211 inputs the scan-in signal SI to the clocked inverter 121; when the scan mode signal S is inactive (Low), the transmission gate 212 inputs either of the outputs of the clocked inverters 111 and 112 to the clocked inverter 121. Because the clocked inverter 211 and the transmission gate 212 receive control signals with their phases opposite to each other, each of them can input a mutually exclusive signal.

An inverter 261 is connected to the output of the inverter 152. The inverter 261 is a circuit that outputs the inverted signal of the output of the inverter 152 as the scan-out signal SO.

According to the fourth variation outlined above, the scan path is set up by partially modifying the circuit structure of the MTCMOS flip-flop embodying the present invention. Although the fourth variation is shown to have a typical structure of the MTCMOS flip-flop provided with a basic scan path arrangement, this is not limitative of the invention. As discussed above in the form of the first through the third variations, the embodiment of the invention also may be furnished with the clearing function, the preset function, or the enable function.

According to the preferred embodiments of the present invention, when the hold signal HLD goes active, the output of the slave flip-flop under non-MTCMOS control is fed back to the master flip-flop under MTCMOS control. This arrangement makes it appreciably simple to adjust the timings for connecting and disconnecting the MTCMOS switch 931. This significantly facilitates the utilization of the MTCMOS technology in ASIC designs.

What has been described above as the preferred embodiments of the present invention with reference to the accompanying drawings corresponds to the appended claims as follows: the description of the preferred embodiments basically provides specific examples supporting what is claimed. If any example of the invention described above as a preferred embodiment does not have an exactly corresponding claim, this does not mean that the example in question has no relevance to the claims. Conversely, if any example of the invention depicted above has a specifically corresponding claim, this does not mean that the example in question is limited to that claim or has no relevance to other claims.

Illustratively, in a flip-flop according to an embodiment of the present invention, the NAND gate 171 and the inverter 172 described above correspond to a clock supply circuit; the inverter 131 and the clocked inverter 132 correspond to a first holding circuit; the inverters 151 and 152 correspond to a second holding circuit; the clocked inverters 111 and 112 to an input switching circuit; and the MTCMOS switch 931 correspond to a power supply control circuit.

Likewise, in a flip-flop according to an embodiment of the present invention, the NAND gates 133 and 151 correspond to a clearing circuit. The NOR gate 191 alternatively corresponds to the clearing circuit.

In a flip-flop according to an embodiment of the present invention, the NAND gates 134 and 154 illustratively correspond to a preset circuit. The NOR gate 193 alternatively corresponds to the preset circuit.

In a flip-flop according to an embodiment of the present invention, the clocked inverters 113 and 114 alternatively correspond to the input switching circuit.

In a flip-flop according to an embodiment of the present invention, as another alternative, the clocked inverters 111, 112 and 211 as well as the transmission gates 212 correspond to the input switching circuit.

Furthermore, in a flip-flop according to an embodiment of the present invention, the MTCMOS control circuit 890 corresponds to a flip-flop control circuit.

The series of steps and processes discussed above as part of the embodiment may be construed as methods for carrying out such steps and processes, as programs for causing a computer to execute such methods, or as a recording medium that stores such programs.

The invention claimed is:

1. A flip-flop comprising:
  a clock supply circuit configured to output a clock signal alternating between a first state and a second state when a sleep signal is inactive, and to fix said clock signal in said first state when said sleep signal is active;
  a first holding circuit configured to fetch an input signal while said clock signal is indicating said first state, and to hold said input signal while said clock signal is indicating said second state;
  a second holding circuit configured to fetch a first signal output by said first holding circuit while said clock signal is indicating said second state, and to hold said first signal while said clock signal is indicating said first state;
  an input switching circuit configured to supply as said input signal a second signal output by said second holding circuit when a hold signal is active, and to supply an external signal as said input signal when said hold signal is inactive; and
  a power supply control circuit configured to supply power to said first holding circuit and said input switching circuit when a power supply control signal is active, and not to supply power to said first holding circuit and said input switching circuit when said power supply control signal is inactive.

2. The flip-flop according to claim 1, wherein said power supply control circuit is an MTCMOS switch.

3. The flip-flop according to claim 1, further comprising a clearing circuit configured to clear the signal held by said second holding circuit when a clear signal is active.

4. The flip-flop according to claim 3, wherein said clearing circuit does not clear the signal held by said second holding circuit when an inhibit signal is active, regardless of what state said clear signal is in.

5. The flip-flop according to claim 1, further comprising a preset circuit configured to preset the signal held by said second holding circuit when a preset signal is active.

6. The flip-flop according to claim 5, wherein said preset circuit does not preset the signal held by said second holding circuit when an inhibit signal is active, regardless of what state said preset signal is in.

7. A flip-flop comprising:
  a clock supply circuit configured to output a clock signal alternating between a first state and a second state when a sleep signal is inactive, and to fix said clock signal in said first state when said sleep signal is active;
  a first holding circuit configured to fetch an input signal while said clock signal is indicating said first state, and to hold said input signal while said clock signal is indicating said second state;
  a second holding circuit configured to fetch a first signal output by said first holding circuit while said clock signal is indicating said second state, and to hold said first signal while said clock signal is indicating said first state;
  an input switching circuit configured to supply as said input signal a second signal output by said second holding circuit either when a hold signal is active or when an enable signal is inactive, and to supply an external signal as said input signal both when said hold signal is inactive and when said enable signal is active; and
  a power supply control circuit configured to supply power to said first holding circuit and said input switching circuit when a power supply control signal is active, and not to supply power to said first holding circuit and said input switching circuit when said power supply control signal is inactive.

8. A flip-flop comprising:

a clock supply circuit configured to output a clock signal alternating between a first state and a second state when a sleep signal is inactive, and to fix said clock signal in said first state when said sleep signal is active;

a first holding circuit configured to fetch an input signal while said clock signal is indicating said first state, and to hold said input signal while said clock signal is indicating said second state;

a second holding circuit configured to fetch a first signal output by said first holding circuit while said clock signal is indicating said second state, and to hold said first signal while said clock signal is indicating said first state;

an input switching circuit configured to supply a scan-in signal as said input signal when a scan mode signal indicates that scan mode is in effect, to supply as said input signal a second signal output by said second holding circuit both when said scan mode signal indicates that scan mode is not in effect and when a hold signal is active, and to supply an external signal as said input signal when said hold signal is inactive; and a power supply control circuit configured to supply power to said first holding circuit and said input switching circuit when a power supply control signal is active, and not to supply power to said first holding circuit and said input switching circuit when said power supply control signal is inactive.

9. A semiconductor integrated circuit comprising:

a clock supply circuit configured to output a clock signal alternating between a first state and a second state when a sleep signal is inactive, and to fix said clock signal in said first state when said sleep signal is active;

a first holding circuit configured to fetch an input signal while said clock signal is indicating said first state, and to hold said input signal while said clock signal is indicating said second state;

a second holding circuit configured to fetch a first signal output by said first holding circuit while said clock signal is indicating said second state, and to hold said first signal while said clock signal is indicating said first state;

an input switching circuit configured to supply as said input signal a second signal output by said second holding circuit when a hold signal is active, and to supply an external signal as said input signal when said hold signal is inactive;

a power supply control circuit configured to supply power to said first holding circuit and said input switching circuit when a power supply control signal is active, and not to supply power to said first holding circuit and said input switching circuit when said power supply control signal is inactive; and a flip-flop control circuit configured to set said power supply control signal not to be active only when at least said sleep signal is active, and to set said power supply control signal to be active only when at least said hold signal is active.

* * * * *